United States Patent
Gerlach et al.

(10) Patent No.: US 11,469,572 B2
(45) Date of Patent: Oct. 11, 2022

(54) VERTICAL CAVITY SURFACE EMITTING LASER

(71) Applicant: TRUMPF Photonic Components GmbH, Ulm (DE)

(72) Inventors: Philipp Henning Gerlach, Ulm (DE); Rainer Michalzik, Ulm (DE); Sven Bader, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 246 days.

(21) Appl. No.: 16/881,018

(22) Filed: May 22, 2020

(65) Prior Publication Data

US 2020/0287351 A1  Sep. 10, 2020

Related U.S. Application Data

(63) Continuation of application No. PCT/EP2018/082251, filed on Nov. 22, 2018.

(30) Foreign Application Priority Data

Nov. 23, 2017 (EP) .................... 17203383

(51) Int. Cl.
*H01S 5/062* (2006.01)
*H01S 5/183* (2006.01)
(Continued)

(52) U.S. Cl.
CPC ...... *H01S 5/18313* (2013.01); *H01S 5/06203* (2013.01); *H01S 5/124* (2013.01);
(Continued)

(58) Field of Classification Search
CPC .. H01S 5/18313; H01S 5/06203; H01S 5/124; H01S 5/125; H01S 5/18341;
(Continued)

(56) References Cited

U.S. PATENT DOCUMENTS 6,169,756 B1  1/2001  Chirovsky et al.
2002/0150135 A1*  10/2002  Naone ............... H01L 24/24
                                                        372/45.011
(Continued)

FOREIGN PATENT DOCUMENTS

WO  WO 2016045935 A1  3/2016

OTHER PUBLICATIONS

Bader, et al., "Optically Controlled Current Confinement in Vertical-Cavity Surface-Emitting Lasers," *IEEE Photonics Technology Letters* 28, 12: 1309-1312 (Jun. 15, 2016). XP011607148.
(Continued)

*Primary Examiner* — Yuanda Zhang
(74) *Attorney, Agent, or Firm* — Leydig, Voit & Mayer, Ltd.

(57) ABSTRACT

A vertical cavity surface emitting laser (VCSEL) has first and second electrical contacts, and an optical resonator. The optical resonator has first and second distributed Bragg reflectors (DBRs), an active layer, a distributed heterojunction bipolar phototransistor (DHBP), and an optical guide. The DHBP has a collector layer, light sensitive layer; a base layer; and an emitter layer. There is an optical coupling between the active layer and the DHBP for providing an active carrier confinement by the DHBP. The optical guide guides an optical mode within the optical resonator during operation. The optical guide is outside a current flow which can be provided by the first and second electrical contacts during operation of the VCSEL. The optical guide is outside a layer sequence between the first and second electrical contacts in the vertical direction of the VCSEL. The optical guide has an oxide aperture arranged in the second DBR.

15 Claims, 7 Drawing Sheets

(51) Int. Cl.
      *H01S 5/12*          (2021.01)
      *H01S 5/125*       (2006.01)
      *H01S 5/20*         (2006.01)

(52) U.S. Cl.
    CPC .......... *H01S 5/125* (2013.01); *H01S 5/18341* (2013.01); *H01S 5/18358* (2013.01); *H01S 5/18369* (2013.01); *H01S 5/2018* (2013.01)

(58) Field of Classification Search
    CPC ............... H01S 5/18358; H01S 5/2018; H01S 2301/18; H01S 5/423
    See application file for complete search history.

(56) References Cited

U.S. PATENT DOCUMENTS

| | | | |
|---|---|---|---|
| 2004/0058467 A1* | 3/2004 | Chirovsky | H01S 5/18341 |
| | | | 438/47 |
| 2004/0086016 A1* | 5/2004 | Kim | B82Y 20/00 |
| | | | 372/46.015 |
| 2017/0302059 A1 | 10/2017 | Gerlach et al. | |

OTHER PUBLICATIONS

Zhou, et al., "Low-Power Phototransceiver Arrays with Vertically Integrated Resonant-Cavity LEDs and Heterostructure Phototransistors," *IEEE Photonics Technology Letters* 13, 11: 1218-1220 (Nov. 1, 2001). XP011426582.

\* cited by examiner

VERTICAL CAVITY SURFACE EMITTING LASER

CROSS-REFERENCE TO PRIOR APPLICATIONS

This application is a continuation of International Patent Application No. PCT/EP2018/082251, filed on Nov. 22, 2018, which claims priority to European Patent Application No. EP 17 203 383.9, filed on Nov. 23, 2017. The entire disclosure of both applications is hereby incorporated by reference herein.

FIELD

The invention relates to a Vertical Cavity Surface Emitting Laser (VCSEL) comprising a distributed heterojunction bipolar phototransistor and an optical guiding structure. The invention further relates to a VCSEL module, an optical sensor comprising such a VCSEL or VCSEL module and a mobile communication device comprising such an optical sensor. The invention finally relates to a corresponding method of fabricating such a VCSEL.

BACKGROUND

WO 2016/045935 A1 discloses a Vertical Cavity Surface Emitting Laser and a method of manufacturing such a Vertical Cavity Surface Emitting Laser. The Vertical Cavity Surface Emitting Laser comprises a distributed heterojunction bipolar phototransistor.

Bader et al., "Optically Controlled Current Confinement in Vertical-Cavity Surface-Emitting Lasers", IEEE Photonics Technology Letters, Vol. 28, No. 12, 2016 discloses a concept for optically controlled current confinement in VCSELs. It is suggested that the laser light beam itself should determine the current path through the device in that a phototransistor is monolithically integrated close to the active region of the VCSEL. Only light-exposed phototransistor areas allow current flow, whereas un- or underexposed regions form a current-blocking layer. Hence, the phototransistor shall work as an optical switch.

US 2017/0302059 A1 discloses a Vertical Cavity Surface Emitting Laser and a method of manufacturing such a Vertical Cavity Surface Emitting Laser. The Vertical Cavity Surface Emitting Laser comprises a first electrical contact, a substrate, a first distributed Bragg reflector, an active layer, a distributed heterojunction bipolar phototransistor, a second distributed Bragg reflector and a second electrical contact, the distributed heterojunction bipolar phototransistor comprising a collector layer, a light sensitive layer, a base layer and an emitter layer, wherein the distributed heterojunction bipolar phototransistor is arranged such that there is an optical coupling between the active layer and the distributed heterojunction bipolar phototransistor for providing an active carrier confinement by means of the distributed heterojunction bipolar phototransistor such that an optical mode of the Vertical Cavity Surface Emitting Laser is self-positioning in accordance with the active carrier confinement during operation of the Vertical Cavity Surface Emitting Laser.

SUMMARY

In an embodiment, the present invention provides a vertical cavity surface emitting laser (VCSEL) that has: a first electrical contact; a second electrical contact; and an optical resonator. The optical resonator has: a first distributed Bragg reflector; an active layer; a distributed heterojunction bipolar phototransistor; a second distributed Bragg reflector; and an optical guiding structure. The distributed heterojunction bipolar phototransistor has: a collector layer; a light sensitive layer; a base layer; and an emitter layer. The distributed heterojunction bipolar phototransistor is arranged such that there is an optical coupling between the active layer and the distributed heterojunction bipolar phototransistor for providing an active carrier confinement by means of the distributed heterojunction bipolar phototransistor. The optical guiding structure is arranged to guide an optical mode within the optical resonator of the VCSEL during operation of the VCSEL. The optical guiding structure is arranged outside a current flow which can be provided by means of the first electrical contact and the second electrical contact during operation of the VCSEL. The optical guiding structure is arranged outside a layer sequence between the first electrical contact and the second electrical contact in the vertical direction of the VCSEL. The optical guiding structure has an oxide aperture, which is arranged in the second distributed Bragg reflector.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
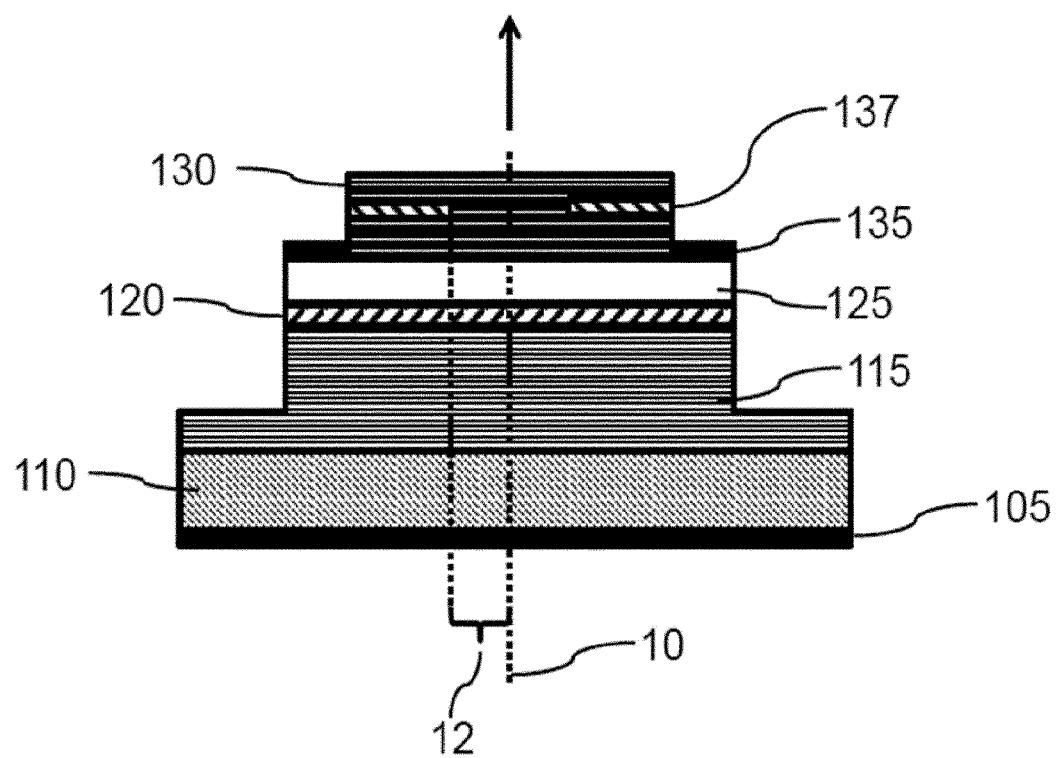
FIG. 1 shows a principal sketch of a first VCSEL with distributed HPT and optical guiding structure.

The present invention provides a VCSEL with improved performance and reliability.

According to a first aspect, a VCSEL is provided. The VCSEL comprises a first electrical contact, a second electrical contact and an optical resonator, the optical resonator comprises a first distributed Bragg reflector, an active layer, a distributed heterojunction bipolar phototransistor, a second distributed Bragg reflector (DBR) and an optical guiding structure. The distributed heterojunction bipolar phototransistor comprises a collector layer, a light sensitive layer, a base layer and an emitter layer. The distributed heterojunction bipolar phototransistor is arranged such that there is an optical coupling between the active layer and the distributed heterojunction bipolar phototransistor for providing an active carrier confinement by means of the distributed heterojunction bipolar phototransistor. The optical guiding structure is arranged to guide an optical mode within the optical resonator of the Vertical Cavity Surface Emitting Laser during operation of the Vertical Cavity Surface Emitting Laser. The optical guiding structure is arranged outside a current flow which can be provided by means of the first electrical contact and the second electrical contact during operation of the Vertical Cavity Surface Emitting Laser. The optical guiding structure may be arranged outside the first electrical contact and the second electrical contact (in a vertical direction of the Vertical Cavity Surface Emitting Laser). The optical guiding structure is arranged outside a layer sequence or stack between the first electrical contact and the second electrical contact in a vertical direction of the Vertical Cavity Surface Emitting Laser. In other words, the optical guiding structure may be arranged such that the optical guiding structure is not between the first electrical contact and the second electrical contact in a vertical direction of the VCSEL. The vertical direction refers to the vertical direction of the cavity of the Vertical Cavity Surface Emitting Laser. The optical guiding structure comprises an oxide aperture which is arranged in the second distributed Bragg reflector. The VCSEL may comprise a substrate (e.g. GaAs substrate). Alternatively, the substrate may be used for processing the VCSEL but removed in a subsequent processing step.

The term "Vertical Cavity Surface Emitting Laser" also includes so-called Vertical External Cavity Surface Emitting Lasers (VECSEL). The abbreviation VCSEL is used for both types of lasers.

VCSELs with active carrier confinement have been developed in the last years. It has been shown by experiment that the phototransistor can be designed and processed as an optical switch such that the carriers are directed to the position of the generated light.

VCSELs with phototransistors are expected to revolutionize the state of the art VCSELs at least because of:

The oxidation layer for charge carrier confinement is supposed to limit the device reliability of VCSELs. VCSELs with phototransistors do not need an oxidation layer for charge carrier confinement, it is therefore expected to overcome actual limitations on reliability.

Existing VCSELs with oxidation layer for current or charge carrier confinement do not have a good match between the carrier and photon density (poor light-to-current alignment). Usually, the highest current densities are close to the edge of the oxide, but the photon density is maximized in the center. It is expected that this effect is limiting the VCSELs' overall wallplug efficiency.

In a VCSEL, the current density in the aperture layer is usually quite high and a voltage drop might occur, limiting the overall efficiency. VCSELs with phototransistors are promising candidates to overcome this limitation.

VCSELs with phototransistors may have more single-mode output power so that this approach may enable completely new fields of applications (VCSELs for heat-assisted magnetic recording (HAMR), etc.).

State-of-the-art VCSELs with phototransistors (see, for example, WO 2016/045935 A1) use the phototransistor for current confinement without special attention on optical confinement. It turned out that although the phototransistor locates the current to the light, latest VCSELs with phototransistors designs have high threshold current and low output power.

Experiments have shown that the mesa geometry has a strong impact on threshold and slope. Lack of optical guiding has been identified as the potential root cause for high threshold current and low output power because optical guiding by the mesa edge seems to involve high optical losses. Further, it has been found that arranging an optical guiding structure outside a layer sequence or stack between the first electrical contact and the second electrical contact in a vertical direction of the VCSEL may enable a more favorable current distribution. For example, local current peaks may be reduced by providing optical confinement rather than electrical current confinement.

The optical guiding structure which is arranged within the optical resonator of the VCSEL (arranged between the lowest layer of the bottom DBR and the uppermost layer of the top DBR) but outside the current flow, which is needed to electrically pump the VCSEL, may avoid the problems of the prior art approaches. Optical confinement by means of the optical guiding structure does not directly interact with the current confinement provided by means of the distributed heterojunction bipolar phototransistor. The current flow is not disturbed by means of the optical guiding structure. There is an indirect interaction because the optical guiding determines positioning of the optical or laser mode and therefore the area or more precise the volume in which the distributed heterojunction bipolar phototransistor gets conductive. Separation of optical confinement and current confinement may enable a more defined position of the optical mode and therefore avoid losses at the mesa edge of the VCSEL. Threshold current may be decreased and optical output power may be increased.

The term "layer" does not exclude that the layer comprises two or more sub-layers. The usage of a (monolithically integrated) distributed heterojunction bipolar phototransistor (HPT) close to the active area may enable an efficient carrier confinement by controlling the carrier injection as a function of the local intensity of the actual profile of the lasing mode, which is influenced by optical guiding provided by means of the optical guiding structure. As a result, the carrier injection may be adapted locally to the demand of the lasing mode and vice versa. The HPT effectively acts as a current confinement layer or structure.

The distributed heterojunction bipolar phototransistor (HPT) with optical sensitive collector-base junction may be designed to avoid optical absorption. The light sensitive layer may be a quantum well layer or a bulk layer. Bulk layers are, for example, homogeneous layers with a thickness of 10 nm or more in which quantum mechanic effects can be neglected.

The HPT is arranged within the VCSEL such that the sensitivity with respect to light, which is generated by means of the active layer of the VCSEL in combination with the optical resonator provided by the first and second DBR, is sufficiently high. The HPT may, for example, be a pnp HPT, which is arranged directly above the active layer meaning at the side of the active layer, which is turned away from the usually n-conducting substrate. In an alternative approach, an npn HPT may be arranged directly below the active layer. Directly means in this respect that the pnp HPT or the npn HPT is arranged as near as possible to the active layer. This does not exclude that there is one or more intermediate layer which may be used to improve, for example, the performance and/or reliability of the VCSEL. The HPT may be stacked in the first or the second DBR after, for example, three or five pairs of mirror layers. The layer structure of the HPT may be integrated in one of the DBR. The thickness of one or more of the HPT layers may be adapted to the emission wavelength of the VCSEL (quarter wavelength layer) in the respective material. One or more layers of the HPT may in this case be used to increase the reflectivity of the respective DBR. Two HPTs may be used one below and one above the active layer.

Positioning of the HPT directly above or below the active provides for the advantage that, due to the low lateral conductivity between the HPT and the active layer, the optical mode fits best to the profile of the respective charge carriers.

The concentration of dopants in the collector layer, the base layer and the emitter layer may be less than $10^{19}$ cm$^{-3}$. The dopants of the layers of the HPT cause optical losses, such that a low doping level is preferred. The emitter layer of the HPT is the layer with the highest doping concentration. The concentration of dopants in the emitter layer may be, for example as low as $5*10^{18}$ cm$^{-3}$ or even $2*10^{18}$ cm$^{-3}$. The concentration of dopants may be as low as $1*10^{18}$ cm$^{-3}$ in the base layer and $4*10^{17}$ cm$^{-3}$ in the collector layer in case of a concentration of dopants of $2*10^{18}$ cm$^{-3}$ in the emitter layer in order to reduce optical losses by means of the charge carriers.

The thickness of the base layer may be 100 nm or less. The HPT may be a pnp HPT, which is arranged between the active layer and the second DBR. The base layer may in this case have a thickness of around ¼ of the emission wavelength of the VCSEL in the material of the base layer. The emission wavelength may depend on the material of the substrate. A GaAs substrate may be used for an emission wavelength between 650 nm and around 1600 nm. A VCSEL with an InP substrate may emit laser light at an emission wavelength of more than or even much more than 1500 nm. The thickness of the collector layer may be in the range of λ/2 of the emission wavelength of the VCSEL in the material.

The optical guiding structure may be arranged such that an effective optical length of the optical resonator is changed in a defined (e.g., radial) distance around a center axis of the optical resonator in comparison to the effective optical length of the optical resonator along the center axis. The effective optical length of the optical resonator along the center axis is longer in comparison to the effective optical length at the defined distance (and distances bigger than the defined distance). The center axis is perpendicular to the layers building the optical resonator. The optical length depends on the materials and refractive index of the materials, which are arranged along the optical path for which the optical length is determined. The effective optical length takes into account the different refractive indices of the semiconductor layers arranged within the optical resonator. The effective optical length is therefore the total optical length between the outer layers (with respect to the active layer) of the first and the second DBR at a defined position with respect to the center axis of the optical resonator parallel to the center axis. The defined distance is the minimum distance in the plane or planes of the optical guiding structures at which the effective optical length of the optical resonator starts to change. The defined distance may, in case of a radially symmetric optical guiding structure, be the radius of the radially symmetric optical guiding structure.

The optical guiding structure is arranged to decrease the effective optical length with increasing radial distance to the center axis of the optical resonator. The optical guiding structure therefore stabilizes the planar optical resonator in a similar way as curved mirrors.

The optical guiding structure may, for example, be arranged to reduce the effective optical length of the optical resonator at distances bigger than the defined distance around the center axis of the optical resonator.

The optical guiding structure may reduce the effective optical length of the optical resonator by means of a reduction of a refractive index of at least one layer of the first distributed Bragg reflector or the second distributed Bragg reflector up to the defined (e.g. radial) distance.

The optical guiding structure comprises one or more oxide apertures, which is arranged in the second distributed Bragg reflector, but as already mentioned outside the current flow (above or below the respective electrical contact). Lateral oxidation of the semiconductor material of the corresponding layer or layers reduces the refractive index of the respective layer up to the defined distance, and therefore, the effective optical length at the respective position perpendicular to the layer or layers. An oxidation rate of the oxide apertures may be controlled by means of the thickness of the respective layer and/or the material composition. One or more $Al_yGa_{(1-y)}As$-layer may, for example, be used in order to change the effective optical length. The oxidation depth may be controlled by providing layers of different thickness (oxidation rate increases with increasing thickness) or by means of the aluminum content of the respective layer (oxidation rate increases with increasing aluminum content). Alternatively or in addition, one or more layer with, for example, continuously changing aluminum content may be provided in order to enable a tapered oxidation profile and therefore a continuous variation or change of the effective optical length.

The optical guiding structure may alternatively be arranged to increase the effective optical length of the optical resonator up to the defined distance around the center axis of the optical resonator. Increasing the effective optical length along and around the center axis of the optical resonator can stabilize the optical resonator, and therefore, enable guiding of the optical mode in a similar way as described with respect to the reduction of the effective optical length with increasing distance to the center axis.

The optical guiding structure may, for example, comprise a phase shift structure which is arranged in the first distributed Bragg reflector or the second distributed Bragg reflector. The phase shift structure may be arranged to increase an effective optical length/effective refractive index of the optical resonator up to the defined distance. The phase shift structure may, for example, comprise a radially symmetric layer comprising Sift or $SiN_x$. The Sift may be a kind of flat or structured cylinder, which is aligned with the center axis in order to increase the effective optical length. Structuration of the cylinder may be used to provide a continuous phase shift. Thickness of the cylinder may, for example, be reduced with increasing distance from the center axis in order to enable a continuous phase shift or continuous reduction of the effective optical length. The phase shift structure may alternatively comprise a layer comprising a GaAs-based semiconductor. The phase shift structure may be a kind of (flat or structured) disk or pillar which is etched in the semiconductor layer comprised by the optical resonator. The layer may be structured such that thickness of the layer reduces with increasing distance to the center axis in order to enable a continuous phase shift or continuous reduction of the effective optical length. The basic structure may be embedded in the layer structure of the corresponding DBR (DBR being in physical contact with the phase shift structure). The corresponding DBR may in this case be a dielectric DBR comprising pairs of non-conducting dielectric layers with different refractive indices as, for example, $Nb_2O_5$, $TiO_2$, $TaO_2$, $Si_3N_4$ and $SiO_2$ layers.

The shape of the optical guiding structure may depend on the cross section of a mesa of the respective VCSEL parallel to the layer structure of the VCSEL. The optical guiding structure may therefore deviate from radial symmetry.

A size of the optical guiding structure may be smaller than an aperture of at least one of the first and the second electrical contact. A size of the optical guiding structure may refer to a size or area of a light-transmissive portion of the optical guiding structure. The size may refer to a size or area in a plane perpendicular to the vertical axis of the Vertical Cavity Surface Emitting Laser. An advantage of this embodiment may be that the optical confinement may be narrower than an electrical confinement. For example, a peak current density at an edge or an electrical contact or an intermediate oxide layer may thus be reduced. A size of the optical guiding structure may be between 5% and 90%, in particular between 10% and 85%, in particular between 25% and 80%, in particular between 50% and 70% of the size or area of the aperture of at least one of the first and the second electrical contact. Different upper and lower boundary values of the aforementioned examples may be combined to provide a further range.

The optical guiding structure may be different from the first and the second distributed Bragg reflector. In particular, the optical guiding structure may be different from the layer sequence of the first and/or the second distributed Bragg reflector.

The optical guiding structure may be arranged to modify at least a portion of at least one of the first and the second distributed Bragg reflector.

The VCSEL may be a mesa structure VCSEL.

The optical guiding structure may have a different refractive index than at least one of the first distributed Bragg reflector and/or the second distributed Bragg reflector. A refractive index of a distributed Bragg reflector may refer to an average refractive index, a minimum refractive index or a maximum refractive index of the distributed Bragg reflector layer sequence. Hence, the optical guiding structure may provide a different optical path length per unit length or per predetermined distance interval than at least one of the first distributed Bragg reflector and/or the second distributed Bragg reflector.

The Vertical Cavity Surface Emitting Laser may further comprise a current spreading layer which is directly attached to the first electrical contact or the second electrical contact. The current spreading layer in the emitter layer may be helpful to lower the resistance especially in combination with a non-conductive dielectric DBR. This may be helpful or needed to achieve low ohmic devices. The current spreading layer may support current distribution in accordance with the optical mode provided by the optical guiding structure. The current spreading layer may be arranged in a node of a standing wave pattern during operation of the Vertical Cavity Surface Emitting Laser in order to reduce optical losses. The optical guiding structure is in this case arranged between the current spreading layer and the outer layer of the DBR which is arranged on a side of the current spreading layer which is opposite with respect to the active layer. The emitter layer may comprise the current spreading layer.

According to a second aspect, a Vertical Cavity Surface Emitting Laser module comprising the Vertical Cavity Surface Emitting Laser according to any embodiment discussed above is provided. The Vertical Cavity Surface Emitting Laser module further comprises a driving circuit for electrically pumping the optical resonator. The electrical driving circuit is arranged to pump the optical resonator or resonators by supplying an electrical current to the respective active layer via the first and the second electrical contact. The electrical driving circuit may be powered by means of an external power source which may be connected by means of an electrical connector.

The Vertical Cavity Surface Emitting Laser module or the Vertical Cavity Surface Emitting Laser may be comprised by an optical sensor. The optical sensor may be comprised by a mobile communication device. The optical sensor may be used in automotive applications especially for autonomous driving. The VCSEL may be further used in array arrangements for, for example, printing or high power applications like additive manufacturing.

According to a further aspect a method of fabricating a Vertical Cavity Surface Emitting Laser is provided. The method comprises the steps of:

providing a first electrical contact,
providing a substrate,
providing a first distributed Bragg reflector,
providing an active layer,
providing a distributed heterojunction bipolar phototransistor comprising a collector layer, a light sensitive (quantum well or bulk) layer, a base layer and an emitter layer,
providing a second distributed Bragg reflector,
providing a second electrical contact,
arranging the heterojunction bipolar phototransistor such that there is an optical coupling between the active layer and the heterojunction bipolar phototransistor for providing an active carrier confinement by means of the heterojunction bipolar phototransistor, providing an optical guiding structure which is arranged to guide an optical mode of the Vertical Cavity Surface Emitting Laser during operation of the Vertical Cavity Surface Emitting Laser, wherein the optical guiding structure is arranged outside a current flow which can be provided by means of the first electrical contact and the second electrical contact during operation of the Vertical Cavity Surface Emitting Laser, wherein the optical guiding structure comprises an oxide aperture which is arranged in the second distributed Bragg reflector.

The steps need not necessarily be performed in the order given above. The substrate may, for example, be provided in a first step and the first electrical contact in a second step. The distributed heterojunction bipolar phototransistor may be provided within the first DBR, between the first DBR and the active layer, between the active layer and the second DBR or within the second DBR. Positioning of the first and the second electrode may depend on the intended laser emission (top or bottom emitting VCSEL). The optical guiding structure may preferably be provided after providing the active layer and the distributed HPT on a side of the active layer pointing away from the substrate. There may be an option to provide the optical guiding structure between the substrate and the first DBR or within the first DBR in case of a bottom emitting VCSEL. Processing of such a VCSEL may be challenging because the active layer has to be processed on top of the optical guiding structure. The substrate may optionally be removed. The different layers may be deposited by epitaxial methods like MOCVD, MBE and the like.

It shall be understood that the VCSEL described above and the method described above have similar and/or identical embodiments.

It Further advantageous embodiments are defined below.

These and other aspects of the invention will be apparent from and elucidated with reference to the exemplary embodiments described hereinafter.

The invention will now be described, by way of example, based on exemplary embodiments with reference to the accompanying drawings.

In the Figures, like numbers refer to like objects throughout. Objects in the Figures are not necessarily drawn to scale.

FIG. 1 shows a principal sketch of a first VCSEL with distributed HPT 125 and optical guiding structure 137. The first VCSEL is a top emitting VCSEL emitting laser light in a direction away from a substrate 110. On the bottom side of the substrate 110, a first electrical contact 105 is provided. On the top side of the substrate 110 is a first DBR 115 provided comprising 30 pairs of layers with a first and a second refractive index. The pairs of layers of the first DBR 115 comprise AlGaAs/GaAs layers. The thickness of the layers is adapted to the emission wavelength of the VCSEL in order to provide the requested reflectivity of more than 99.9%. On top of the first DBR 115 is an active layer 120. The active layer 120 comprises a quantum well structure for light generation. An n-current injection layer (not shown) may be arranged between the first DBR 115 and the active layer 120. A distributed HPT 125 is provided on top of the active layer 120. A second DBR 130 is provided on top of the distributed HPT 125. The second DBR 130 comprises 15 pairs of layers which comprise AlGaAs/GaAs layers. The thickness of the pair of layers is adapted to the emission wavelength of the VCSEL in order to provide the requested reflectivity of around 98%. A ring shaped second electrical contact 135 is arranged around the second DBR 130 above the distributed HPT 125. The VCSEL emits laser light in the direction of the arrow via the second DBR 130. The distributed HPT 125 is arranged above the active layer 120 and is thus a pnp HPT. The optical guiding structure 137 is an oxide aperture consisting of oxidized AlGaAs layer of the second DBR 130. The oxidized layer is arranged above a level of the second electrical contact 135. The oxidized layer defines in this embodiment a circular volume around a center axis 10 with a defined distance 12 with respect to the center axis 10. The defined distance 12 is in this circular symmetric embodiment (mesa with circular cross-section parallel to the layer structure) a defined radius around the center axis 10. The optical resonator of the VCSEL consists of the layers embedded between the outer layers of the first DBR 115 and the second DBR 130. One or more of the layers of the second DBR 130 (especially the layers next to the distributed HPT 125) may be highly doped in order to enable high electrical conductivity. The ring shaped second electrical contact 135 may in this case be arranged to provide the electrical current via the highly doped layers of the second DBR 130. These layers may act in this embodiment as current spreading layer.

Figure 2:
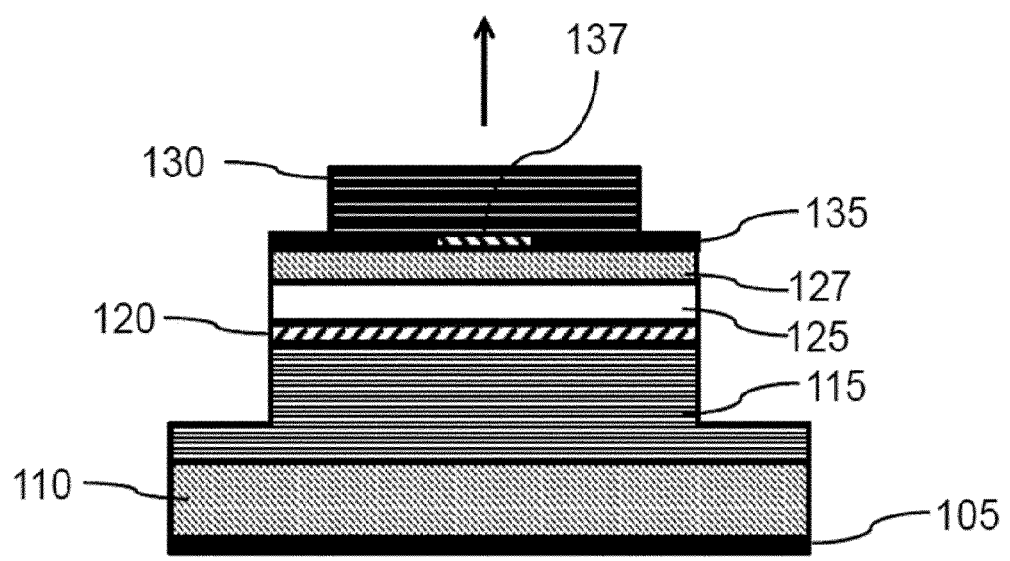
FIG. 2 shows a principal sketch of a second VCSEL with distributed HPT and optical guiding structure.

FIG. 2 shows a principal sketch of a second VCSEL with distributed HPT 125 and optical guiding structure 137. The second VCSEL is a top emitting VCSEL emitting laser light in a direction away from a substrate 110. A first electrical contact 105 is provided on the bottom side of the substrate 110. The principle arrangement of the layers starting with the first electrical contact 105 and the distributed HPT 125 are essentially the same as described with respect to FIG. 1. A current spreading layer 127 is arranged on top of the distributed HPT 125. A second DBR 130 is provided on top of the distributed HPT 125. The second DBR 130 is a dielectric DBR comprising pairs of non-conducting dielectric layers with different refractive indices as, for example, $Nb_2O_5$, $TiO_2$, $TaO_2$, $Si_3N_4$ and $SiO_2$ layers. The number of pair of layers depends on the materials and the intended reflectivity. The thickness of the pair of layers is adapted to the emission wavelength of the VCSEL in order to provide the requested reflectivity of around 97%. A ring shaped second electrical contact 135 is arranged around the second dielectric DBR 130 above the distributed HPT 125. The VCSEL emits laser light in the direction of the arrow via the second dielectric DBR 130. The optical guiding structure 137 is circular symmetric $SiO_2$ layer which is arranged around a center axis of the optical resonator which is built by the first DBR 115 and the second DBR 130 and the layers arranged between the first DBR 115 and the second DBR 130. The circular symmetric $SiO_2$ layer is embedded between the current spreading layer 127 and the second DBR 130. The $SiO_2$ layer is deposited on top of the current spreading layer 127 and subsequently etched to get the in this embodiment circular shape. The dielectric layers of the second DBR 130 are subsequently deposited on top of the circular symmetric $SiO_2$ layer and the current spreading layer 127 where the current spreading layer 127 was exposed by etching the $SiO_2$ layer. The $SiO_2$ layer increases the effective optical length of the laser cavity perpendicular to the layer structure of the second VCSEL within a defined distance around the center axis of the optical resonator.

Figure 3:
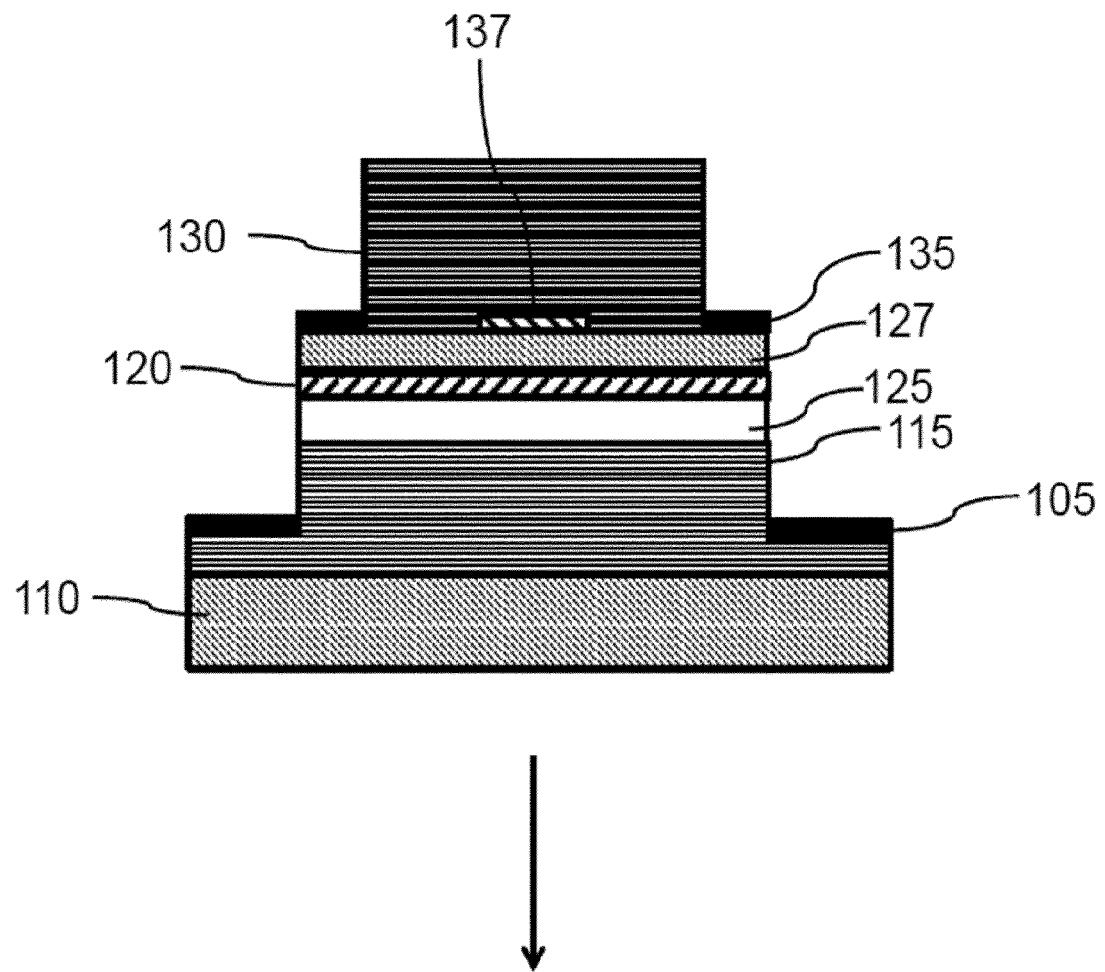
FIG. 3 shows a principal sketch of a third VCSEL with distributed HPT and optical guiding structure.

FIG. 3 shows a principal sketch of a third VCSEL with distributed HPT 125 and optical guiding structure 137. The third VCSEL is a bottom emitting VCSEL emitting laser light via substrate 110. The emission wavelength of the VCSEL has therefore to be arranged in a way that the (e.g. GaAs) substrate 110 is transparent with respect to the emission wavelength. On the top side of the substrate 110 is a first DBR 115 provided comprising 20 pairs of layers with a first and a second refractive index. The pairs of layers of the first DBR 115 comprise AlGaAs/GaAs layers. The thickness of the layers is adapted to the emission wavelength of the VCSEL in order to provide the requested reflectivity of around 96%. The first DBR 115 is partly etched in order to deposit a first electrical contact 105. The layer of the first DBR 115 on which the first electrical contact 105 is provided may be characterized by increased electrical conductivity (high doping) in order to distribute the electrical current in the lateral direction parallel to the layer structure of the VCSEL (current distribution layer). A distributed HPT 125 is provided on top of the first DBR 115. The distributed HPT 125 is arranged below the active layer 120 and is thus an npn HPT. An active layer 120 is provided on top of the distributed HPT 125 and a current spreading layer 127 is arranged on top of the active layer 120. A second DBR 130 is provided on top of the distributed HPT 125 similar as discussed with respect to FIG. 2. The second DBR 130 is again a dielectric DBR comprising pairs of non-conducting dielectric layers with different refractive indices as, for example, $Nb_2O_5$, $TiO_2$, $TaO_2$, $Si_3N_4$ and $SiO_2$ layers. The thickness of the pair of layers is adapted to the emission wavelength of the VCSEL in order to provide the requested reflectivity of more than 99.99%. A ring shaped second electrical contact 135 is arranged around the second dielectric DBR 130 above the distributed HPT 125. The VCSEL emits laser light in the direction of the arrow via the first DBR 115. The optical guiding structure 137 is a non-circular symmetric (e.g. star shaped) semiconductor pillar which is arranged around a center axis of the optical resonator. The non-circular symmetric semiconductor pillar is embedded between the current spreading layer 127 and the second DBR 130. The non-circular symmetric semiconductor pillar is etched after depositing the current spreading layer 127.

The dielectric layers of the second DBR 130 are subsequently deposited on top of the semiconductor pillar and the surrounding current spreading layer 127. The increased thickness of the optical resonator, which is provided by means of the semiconductor pillar, increases the effective optical length of the laser cavity perpendicular to the layer structure of the second VCSEL around the center axis of the optical resonator in accordance with the shape of the pillar.

Figure 4:
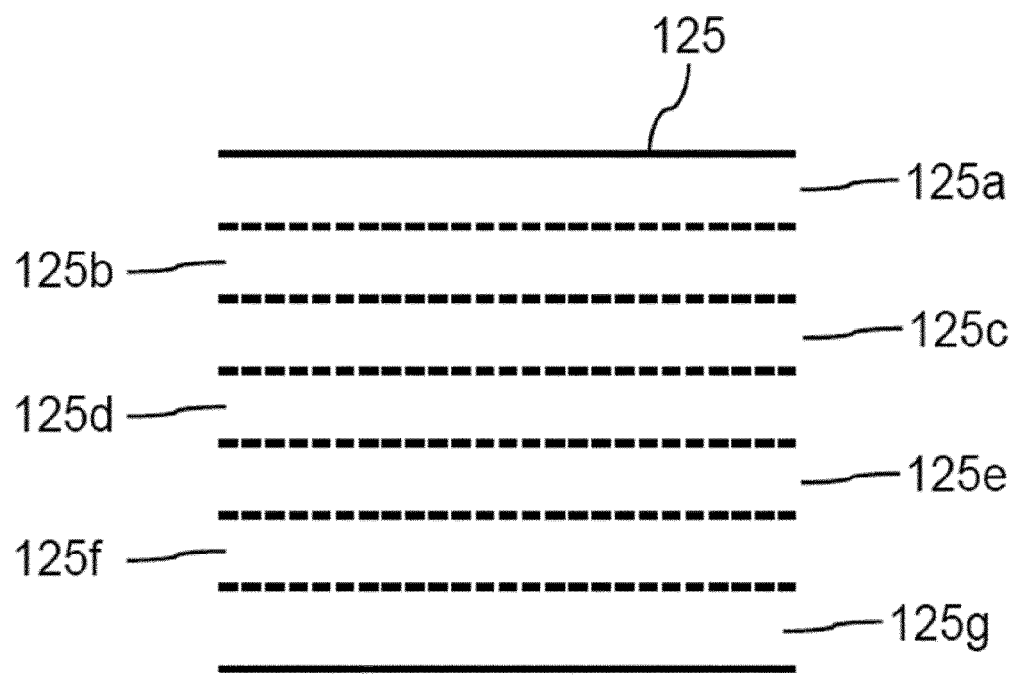
FIG. 4 shows a principal sketch of an embodiment of a layer arrangement of the distributed HPT.

FIG. 4 shows a principal sketch of an embodiment of a layer arrangement of the distributed HPT 125, which may be integrated in the first, second or third VCSEL. The distributed HPT comprises a collector layer 125a, a first intermediate layer 125b, a light sensitive layer 125c, a second intermediate layer 125d, a base layer 125e, an optional wide-gap emitter 125f and an emitter layer 125g. The collector layer 125a comprises GaAs with a thickness of 50 nm and a concentration of Carbon atoms of $4*10^{17}$ cm$^{-3}$. The first intermediate layer 125b is arranged below the collector layer 125a and comprises a 5 nm layer of GaAs. The light sensitive layer 125c is arranged below the first intermediate layer 125b and comprises a light sensitive quantum well layer comprising $Ga_{0.73}In_{0.27}As$ with a thickness of 5 nm. The second intermediate layer 125d is arranged below the light sensitive layer 125c and comprises a 5 nm layer of GaAs. The base layer 125e is arranged below the second intermediate layer 125d and comprises GaAs with a thickness of 35 nm and a concentration of Silicon atoms of $1.5*10^{18}$ cm$^{-3}$. The emitter layer is in this embodiment split in two parts a wide-gap emitter 125f and the emitter 125g which is arranged below the base layer 125e and comprises $Al_{0.24}Ga_{0.76}As$ with a thickness of 25 nm and a concentration of Carbon atoms of $1.5*10^{18}$ cm$^{-3}$. The material composition of the different layers may vary in accordance with requirements of the VCSEL. The doping concentration in the collector layer has significant impact on the HPT breakdown voltage. It may thus be preferred to use a carbon doping of less than $1.5*10^{18}$ cm$^{-3}$.

Figure 5:
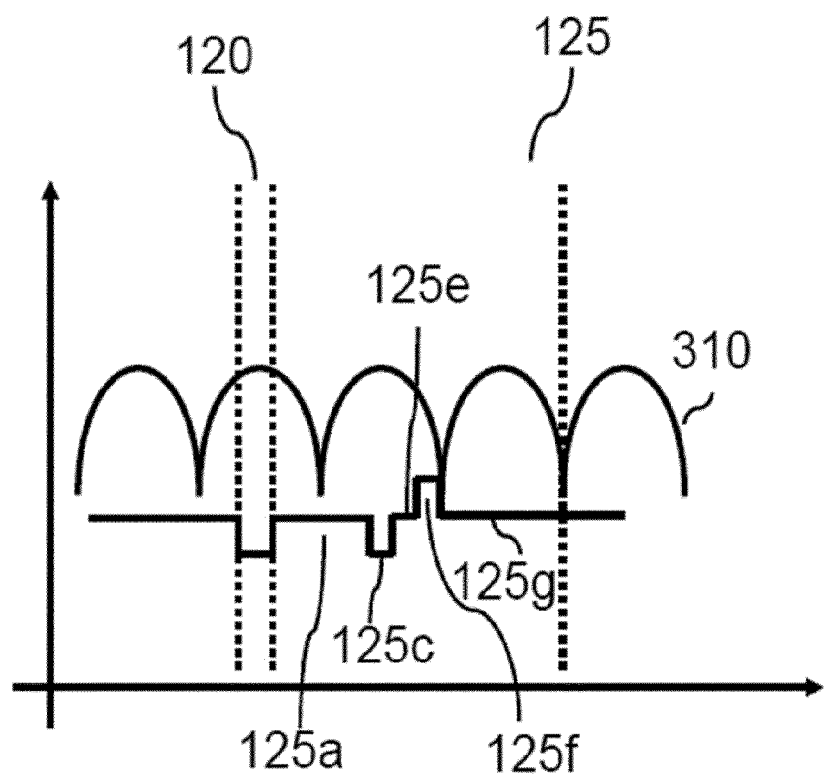
FIG. 5 shows a principal sketch of a standing wave pattern and the trend of the conduction band of a VCSEL in relation to the layer arrangement of the distributed HPT.
Figure 6:
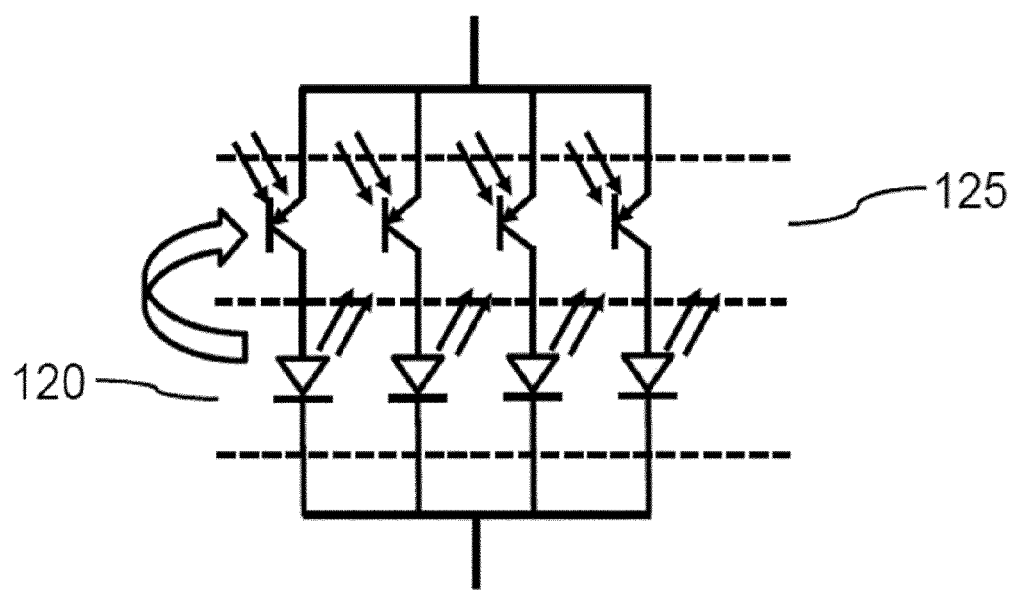
FIG. 6 shows an equivalent circuit of the distributed HPT and the active layer.

The distributed HPT as shown in FIG. 4 may, for example, be integrated in the first VCSEL depicted in FIG. 1. The distributed HPT may thus be arranged just above the active layer 120. The arrangement of the active layer 120 and the distributed HPT 125 is shown together with a standing wave pattern 310 of the first VCSEL in FIG. 5. The active layer 120 is arranged in a maximum of the standing wave pattern 310. The thickness of the collector layer 125a and potential intermediate layer are arranged such that the light sensitive layer 125c is also placed in a maximum of the standing wave pattern 310 to enable maximum feedback between the active layer 120 and the light sensitive layer 125c. A corresponding equivalent circuit of the distributed HPT and the active layer is shown in FIG. 6. There is some optical coupling between active layer 120 and HPT layer 125 which is indicated by the arrow. As the active layer 120 needs to be put in a resonator, the coupling is not 1:1, but it depends on lateral quality of resonator how strong the actual coupling is. This leads to current filamentation and carrier confinement. Carrier confinement is further supported by the optical guiding structure 137 providing the optimum position of the laser mode within the optical resonator.

Figure 7:
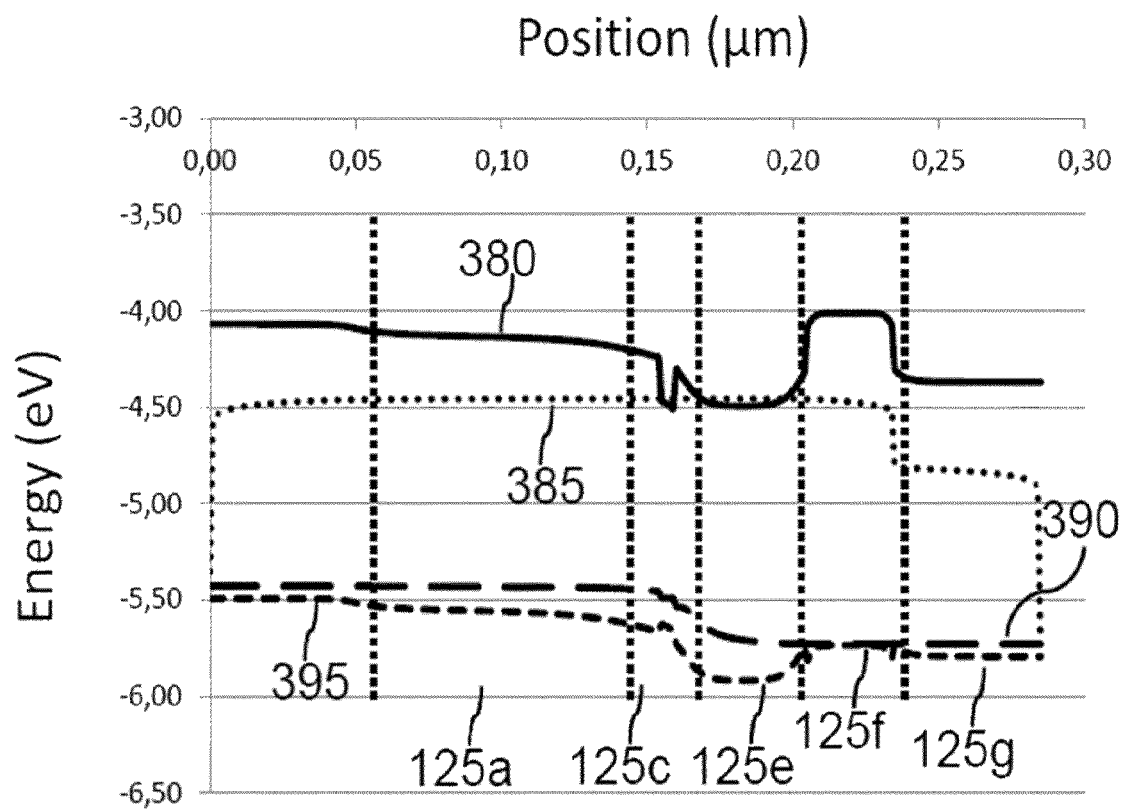
FIG. 7 shows a graph showing a band diagram of a distributed HPT within a VCSEL.

FIG. 7 shows a graph showing a band diagram of a distributed HPT within a VCSEL. The graph shows the conduction band 380, the Fermi level of the electrons 385, the Fermi level of the holes 390 and the valence band 395 across the different layers of the distributed HPT. The n doping by means of Silicon atoms in the base layer 125e in combination with the step in the valence band 395 of the AlGaAs emitter layer 125f hinders the holes to come from emitter layer to the collector layer 125a. If the distributed HPT 125 is irradiated with some light that is absorbed in the light sensitive layer 125c (InGaAs QW) between collector layer 125a and base layer 125e, an electron-hole pair will be generated for each photon. The electron will travel to the base layer 125e and generate a forward current through the base-emitter hetero junction. This forward current will also cause a much larger hole-current (from emitter layer to collector layer 125a), which is well known as transistor effect. High current gains of ~1000 may be possible with the distributed HPT structure as discussed above.

Figure 8:
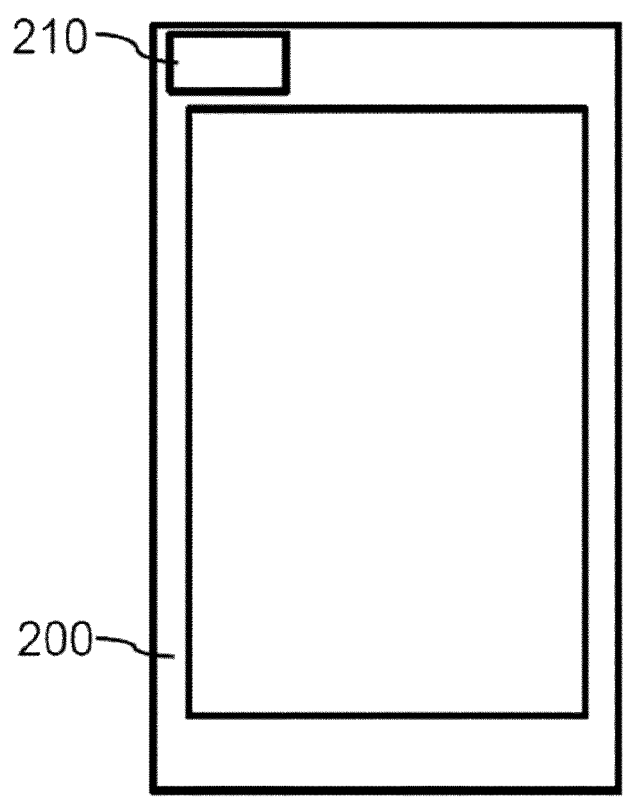
FIG. 8 shows a principal sketch of a mobile communication device.
Figure 9:
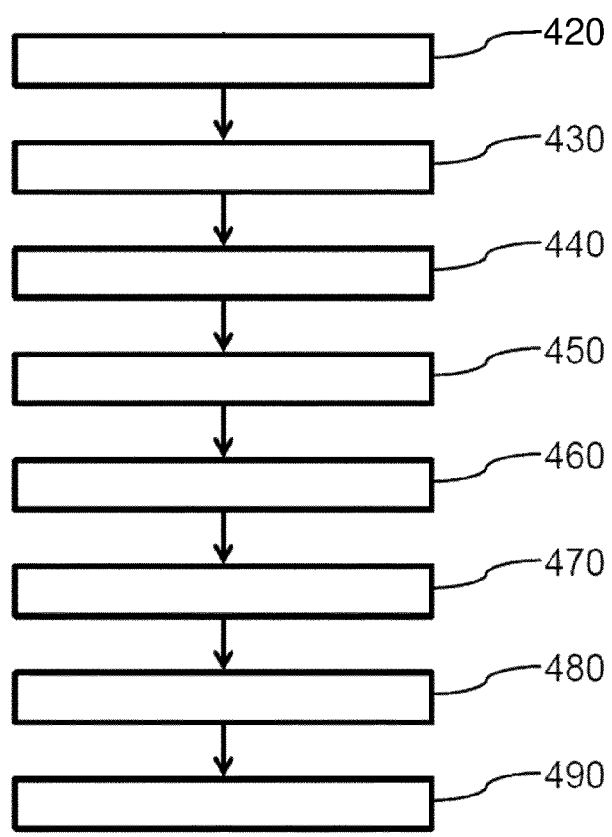
FIG. 9 shows a principal sketch of a process flow of a method of fabricating a VCSEL according to the present invention.

FIG. 8 shows a principal sketch of a mobile communication device 200 comprising an optical sensor 210 comprising a VCSEL as described above. The optical sensor 210 can, for example, be used in combination with a software application running on the mobile communication device 200. The software application may use the optical sensor 210 for sensing applications. Such sensing applications may be time of flight measurements for distance detection, camera autofocus, 3-D imaging of a scene or a gesture based user interface FIG. 9 shows a principal sketch of a process flow of a method of fabricating a VCSEL according to the present invention. A first electrical contact 105 is provided in step 410. The first electrical contact 105 is attached to a bottom side of a GaAs substrate 110, which is provided in step 420. A first DBR 115 is provided on a top side of the substrate 110 in step 430 and an active layer 120 is provided in subsequent step 440 on top of the first DBR 115. A distributed heterojunction bipolar phototransistor 125 is provided in step 450 on top of the active layer 120. On top of the distributed heterojunction bipolar phototransistor 125 is a second DBR 130 provided in step 460. A second electrical contact 135 is provided for electrically contacting the VCSEL in step 470. The distributed heterojunction bipolar phototransistor 125 provided in step 480 is arranged such that there is an optical coupling between the active layer 120 and the distributed heterojunction bipolar phototransistor 125 for providing an active carrier confinement by means of the distributed heterojunction bipolar phototransistor 125. The arrangement of the distributed heterojunction bipolar phototransistor 125 may be performed by positioning the distributed heterojunction bipolar phototransistor 125 within the first DBR 115, between the first DBR 115 and the active layer 120, between the active layer 120 and the second DBR 130 or within the second DBR 130. An optical guiding structure 137 is provided in step 490. The optical guiding structure 137 is arranged outside the current flow of the VCSEL during operation of the VCSEL. The optical guiding structure 137 is further arranged to guide an optical mode of the VCSEL during operation of the VCSEL.

The layers of the first DBR, the active layer, the second, the distributed heterojunction bipolar phototransistor and any other layer as current injection layers and the like may be deposited by epitaxial methods like MOCVD or MBE.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 center axis
12 defined distance
105 first electrical contact
110 substrate
115 first distributed Bragg reflector
120 active layer
125 distributed heterojunction bipolar phototransistor
125a collector layer
125b first intermediate layer
125c light sensitive layer
125d second intermediate layer
125e base layer
125f wide-gap emitter
125g emitter
127 current spreading layer
130 second distributed Bragg reflector
135 second electrical contact
137 optical guiding structure
310 standing wave pattern
380 conduction band
385 Fermi level electrons
390 Fermi level holes
395 valence band
200 mobile communication device
210 optical sensor
410 step of providing a first electrical contact
420 step of providing a substrate
430 step of providing a first distributed Bragg reflector
440 step of providing an active layer
450 step of providing a distributed heterojunction bipolar phototransistor
460 step of providing a second distributed Bragg reflector
470 step of providing a second electrical contact
480 step of arranging the distributed heterojunction bipolar phototransistor
490 step of providing optical guiding structure

The invention claimed is:

1. A vertical cavity surface emitting laser comprising:
a first electrical contact;
a second electrical contact; and
an optical resonator, the optical resonator comprising:
 a first distributed Bragg reflector;
 an active layer;
 a distributed heterojunction bipolar phototransistor;
 a second distributed Bragg reflector; and
 an optical guiding structure,
wherein the distributed heterojunction bipolar phototransistor comprises a collector layer, a light sensitive layer, a base layer, and an emitter layer,
wherein the distributed heterojunction bipolar phototransistor is arranged such that there is an optical coupling between the active layer and the distributed heterojunction bipolar phototransistor for providing an active carrier confinement by means of the distributed heterojunction bipolar phototransistor,
wherein the optical guiding structure is arranged to guide an optical mode within the optical resonator of the vertical cavity surface emitting laser during operation of the vertical cavity surface emitting laser, and a position of the optical mode determines a volume in which the distributed heterojunction bipolar phototransistor becomes conductive,
wherein the optical guiding structure is arranged outside a current flow which can be provided by means of the first electrical contact and the second electrical contact during operation of the vertical cavity surface emitting laser,
wherein the optical guiding structure is arranged outside a layer sequence between the first electrical contact and the second electrical contact in the vertical direction of the vertical cavity surface emitting laser, and
wherein the optical guiding structure comprises an oxide aperture, which is arranged in the second distributed Bragg reflector.

2. The vertical cavity surface emitting laser according to claim 1, wherein a size of the optical guiding structure is smaller than an aperture of at least one of the first electrical contact or the second electrical contact.

3. The vertical cavity surface emitting laser according to claim 1, wherein the optical guiding structure has a different refractive index than at least one of the first distributed Bragg reflector or the second distributed Bragg reflector.

4. The vertical cavity surface emitting laser according to claim 1, wherein the vertical cavity surface emitting laser further comprises a current spreading layer, which is directly attached to the first electrical contact or the second electrical contact.

5. The vertical cavity surface emitting laser according claim 4, wherein the current spreading layer is arranged in a node of a standing wave pattern during operation of the vertical cavity surface emitting laser.

6. The vertical cavity surface emitting laser according claim 5, wherein the emitter layer comprises the current spreading layer.

7. An optical sensor comprising the vertical cavity surface emitting laser according to claim 1.

8. A mobile communication device, the mobile communication device comprising at least one optical sensor comprising the vertical cavity surface emitting laser according to claim 1.

9. A vertical cavity surface emitting laser comprising:
a first electrical contact;
a second electrical contact; and
an optical resonator, the optical resonator comprising:
a first distributed Bragg reflector;
an active layer;
a distributed heterojunction bipolar phototransistor;
a second distributed Bragg reflector; and
an optical guiding structure,
wherein the distributed heterojunction bipolar phototransistor comprises a collector layer, a light sensitive layer, a base layer, and an emitter layer,
wherein the distributed heterojunction bipolar phototransistor is arranged such that there is an optical coupling between the active layer and the distributed heterojunction bipolar phototransistor for providing an active carrier confinement by means of the distributed heterojunction bipolar phototransistor,
wherein the optical guiding structure is arranged to guide an optical mode within the optical resonator of the vertical cavity surface emitting laser during operation of the vertical cavity surface emitting laser,
wherein the optical guiding structure is arranged outside a current flow which can be provided by means of the first electrical contact and the second electrical contact during operation of the vertical cavity surface emitting laser,
wherein the optical guiding structure is arranged outside a layer sequence between the first electrical contact and the second electrical contact in the vertical direction of the vertical cavity surface emitting laser,
wherein the optical guiding structure comprises an oxide aperture, which is arranged in the second distributed Bragg reflector
wherein the optical guiding structure is arranged such that an effective optical length of the optical resonator changes in a defined distance around a center axis of the optical resonator in comparison to the effective optical length of the optical resonator along the center axis,
wherein the effective optical length of the optical resonator along the center axis is longer in comparison to the effective optical length in the defined distance, and
wherein the center axis is perpendicular to the layers building the optical resonator.

10. The vertical cavity surface emitting laser according to claim 9,
wherein the optical guiding structure is arranged to reduce the effective optical length of the optical resonator at distances bigger than the defined distance around the center axis of the optical resonator.

11. The vertical cavity surface emitting laser according to claim 10,
wherein the optical guiding structure reduces the effective optical length of the optical resonator by means of a reduction of a refractive index of at least one layer of the first distributed Bragg reflector or the second distributed Bragg reflector up to the defined distance.

12. The vertical cavity surface emitting laser according to claim 9, wherein the optical guiding structure is arranged to increase the effective optical length of the optical resonator up to the defined distance around the center axis of the optical resonator.

13. The vertical cavity surface emitting laser according to claim 12,
wherein the optical guiding structure is a phase shift structure, and
wherein the phase shift structure is arranged to increase an effective optical length of the optical resonator up to the defined distance.

14. The vertical cavity surface emitting laser according to claim 13, wherein the phase shift structure comprises a layer comprising a material selected out of the group comprising $SiO_2$, $SiN_x$ and a GaAs-based semiconductor.

15. A method of fabricating a vertical cavity surface emitting laser, the method comprising:
providing a first electrical contact;
providing a substrate;
providing a first distributed Bragg reflector;
providing an active layer;
providing a distributed heterojunction bipolar phototransistor comprising a collector layer, a light sensitive layer, a base layer and an emitter layer,
providing a second distributed Bragg reflector;
providing a second electrical contact;
arranging the heterojunction bipolar phototransistor such that there is an optical coupling between the active layer and the heterojunction bipolar phototransistor for providing an active carrier confinement by means of the heterojunction bipolar phototransistor; and
providing an optical guiding structure, wherein the optical guiding structure is arranged to guide an optical mode of the vertical cavity surface emitting laser during operation of the vertical cavity surface emitting laser, and a position of the optical mode determines a volume in which the distributed heterojunction bipolar phototransistor becomes conductive,
wherein the optical guiding structure is arranged outside a current flow which can be provided by means of the first electrical contact and the second electrical contact during operation of the vertical cavity surface emitting laser,
wherein the optical guiding structure is arranged outside a layer sequence between the first electrical contact and the second electrical contact in the vertical direction of the vertical cavity surface emitting laser, and
wherein the optical guiding structure comprises an oxide aperture which is arranged in the second distributed Bragg reflector.

* * * * *